(12) United States Patent
Huber et al.

(10) Patent No.: US 10,753,985 B2
(45) Date of Patent: Aug. 25, 2020

(54) DETERMINING ELECTRICAL CONTACTING BETWEEN AN ELECTRICAL SYSTEM AND A MEASURING SYSTEM

(71) Applicant: AVL DiTest GmbH, Graz (AT)

(72) Inventors: Christian Huber, Graz (AT); Roman Riegler, Rinn (AT)

(73) Assignee: AVL DiTest GmbH, Graz (AT)

( * ) Notice: Subject to any disclaimer, the term of this patent is extended or adjusted under 35 U.S.C. 154(b) by 79 days.

(21) Appl. No.: 16/094,552

(22) PCT Filed: Apr. 13, 2017

(86) PCT No.: PCT/EP2017/058987
§ 371 (c)(1),
(2) Date: Oct. 18, 2018

(87) PCT Pub. No.: WO2017/182391
PCT Pub. Date: Oct. 26, 2017

(65) Prior Publication Data
US 2019/0101582 A1 Apr. 4, 2019

(30) Foreign Application Priority Data
Apr. 18, 2016 (AT) ............... A 50339/2016

(51) Int. Cl.
*G01R 31/68* (2020.01)
*B60L 3/00* (2019.01)
(Continued)

(52) U.S. Cl.
CPC ............ *G01R 31/68* (2020.01); *B60L 3/0069* (2013.01); *B60L 3/12* (2013.01); *G01R 19/155* (2013.01);
(Continued)

(58) Field of Classification Search
CPC ...... B60L 3/12; B60L 3/0069; B60Y 2200/91; B60Y 2200/92; B60K 6/20; G01R 31/043; G01R 19/155; G01R 31/006
See application file for complete search history.

(56) References Cited

U.S. PATENT DOCUMENTS 6,424,157 B1 * 7/2002 Gollomp ............... B60L 58/12
324/430
7,902,828 B2 * 3/2011 Huang ............... G01R 31/389
324/430
(Continued)

FOREIGN PATENT DOCUMENTS

DE 10325389 A1 12/2004
DE 102011004288 A1 8/2012
(Continued)

OTHER PUBLICATIONS

Austrian Search Report Application No. A 50339/2016 Completed: Mar. 30, 2017; dated Apr. 4, 2017 3 pages.
International Search Report, Written Opinion of the International Searching Authority and Translation Application No. PCT/EP2017/058987 Completed: Jul. 10, 2017; dated Jul. 20, 2017 15 pages.

*Primary Examiner* — Vinh P Nguyen
(74) *Attorney, Agent, or Firm* — Whitmyer IP Group LLC

(57) ABSTRACT

To determine in a simple and unequivocal manner whether measurement contacts at which a voltage is to be measured have been properly contacted in a measurement system, in the measurement system, after a discharge switch connecting a charging circuit to a voltage measurement device is closed, the charging circuit is discharged via an internal resistance of the voltage measurement device. When the discharge switch is closed, after a measurement switch connecting the voltage measurement device to the measurement contacts is closed, it is established whether the electrical system is contacted with the measurement system by analyzing the voltage curve at the voltage measurement device after closure of the measurement switch. Advanta-
(Continued)

geously, after the discharge switch is closed, the charging circuit is discharged via a discharge resistor connected in series or in parallel with the voltage measurement device and via the internal resistance.

17 Claims, 2 Drawing Sheets

(51) Int. Cl.
*G01R 19/155* (2006.01)
*B60L 3/12* (2006.01)
*G01R 31/00* (2006.01)
*B60K 6/20* (2007.10)

(52) U.S. Cl.
CPC ............. *B60K 6/20* (2013.01); *B60Y 2200/91* (2013.01); *B60Y 2200/92* (2013.01); *G01R 31/006* (2013.01)

(56) References Cited

U.S. PATENT DOCUMENTS

| | | | |
|---|---|---|---|
| 7,928,735 B2* | 4/2011 | Huang | B60L 58/12 |
| | | | 324/426 |
| 2007/0176604 A1 | 8/2007 | Morimoto | |
| 2015/0303532 A1* | 10/2015 | Fink | B60L 58/16 |
| | | | 324/430 |

FOREIGN PATENT DOCUMENTS

| | | |
|---|---|---|
| DE | 102012200722 A1 | 7/2013 |
| DE | 102013009802 B3 | 10/2014 |
| EP | 2487496 A1 | 8/2012 |
| JP | 2000230960 A | 8/2000 |

* cited by examiner

DETERMINING ELECTRICAL CONTACTING BETWEEN AN ELECTRICAL SYSTEM AND A MEASURING SYSTEM

TECHNICAL FIELD

The present teaching relates to a method and to a device for determining an electrical contacting of an electrical system with a measurement system, the measurement system being connectable to measurement points of the electrical system by means of measurement contacts, and also relates to the use of the device.

BACKGROUND

For servicing works on electrical systems, it must be determined whether the electrical system is de-energized before said works can be carried out. Simply disconnecting the electrical system from the electricity supply grid or the electrical energy supply is not a reliable enough basis for determining that the circuit is de-energized since electrical energy may still be stored in electrical energy stores, e.g. capacitors. In addition, other electrostatic charges which may lead to a low residual voltage in the electrical system are also conceivable. Yet voltage measurement on the electrical system does not guarantee the system is de-energized either, even if no voltage is detected. Due to possible contacting faults between the measurement contacts of a measurement instrument and the equipment under test, a de-energized state may be erroneously indicated, or a low residual voltage may be indicated despite the distinct possibility of a (high) voltage still being applied at the equipment under test. In addition, an electrostatic charge in the electrical system may lead to a low voltage being displayed due to the high-resistance input of a voltage measurement device. The display of a very low voltage may thus also originate from the system due to faulty contacting or a residual voltage actually being present.

Therefore, to reliably determine whether an electrical system is de-energized in order to be able to reliably carry out further work on the electrical system, the contacting of the measurement contacts of the measurement instrument must be checked. In the event of faulty contacting, a relatively low voltage or in the worst case scenario no voltage at all could be measured as being applied between the measurement contacts; this is a potential danger for people who will be carrying out work on the electrical system. However, conventional measurement instruments do not offer this function. Previously, therefore, contacting checks have been carried out visually. In other words, the user checks visually whether the measurement contacts properly contact the equipment under test. However, in many applications, e.g. in vehicles having electrified propulsion, the confined spaces or position of the measurement contacts mean visual verification of the contacting cannot be carried out or cannot be carried out unequivocally. Moreover, conclusions on actual electrical contacting cannot always be made on the basis of visual contacting.

It would be conceivable to use the resistance measurement, often provided for in measurement instruments, for the purposes of a contacting check. In this case, a current or voltage source is integrated in the measurement instrument and conclusions can be drawn on a contacted measurement contact by measuring the current flow via the measurement contacts of the measurement instrument. In this manner, however, only purely ohmic resistance and additionally only low-ohmic resistance can be detected. A contacting error, which can be equated to a high-ohmic resistance, cannot be reliably and unequivocally determined in this manner. In addition, a high residual voltage can lead to destruction of the measurement instrument if said instrument is in resistance measurement mode.

SUMMARY

Therefore, an object of the present teaching is to disclose a measurement system that makes it possible to unequivocally determine in a simple manner whether measurement contacts at which a voltage is to be measured have been properly contacted.

This object is achieved by, after a discharge switch connecting a charging circuit to a voltage measurement device is closed, the charging circuit is discharged via an internal resistance of the voltage measurement device in the measurement system, and that, when the discharge switch is closed, after a measurement switch connecting the voltage measurement device to the measurement contacts is closed, the electrical contact of the electrical system with the measurement system is being determined by analyzing, in an analysis unit, the voltage curve at the voltage measurement device after closure of the measurement switch. The electrical system may be contacted completely, partly or not at all, for example. The voltage curve at the voltage measurement device can also be displayed by a display unit.

The analysis of the voltage curve after closure of the measurement switch can be the detection of a sudden voltage change, for example; this can be done, for example, by differentiating the voltage. A target voltage curve could also be measured and compared with the actual voltage curve. It would also be possible to integrate the voltage curve, etc.

Advantageously, however, also a characteristic voltage curve of the measurement system can be recorded by means of the voltage measurement device after the discharge switch is closed and before the measurement switch is closed. The characteristic voltage curve is compared with the voltage curve after closure of the measurement switch, resulting in conclusions being made on contacting.

The charging circuit is discharged in principle via the internal resistance of the voltage measurement device. It is also possible to influence the discharging process by means of a discharge resistor connected to the voltage measurement device, as a result of which the charging circuit is also discharged via the discharge resistor. Said discharge resistor can be connected both in parallel and in series with the voltage measurement device. If it is connected in parallel, the total resistance of the circuit is reduced and the discharging process accelerated. If it is connected in series, the total resistance is increased, resulting in the discharging process lasting longer. However, a discharge resistor in series also has a current-limiting effect. In addition, the dimensioning of the discharge resistor influences the time constant. In general, the charging circuit has capacitive components; increasing the circuit resistance in the form of connecting the discharge resistor in series increases the time constant and likewise reduces the flowing current. This can be used to limit the current. Connecting the discharge resistor in parallel causes a reduction in the circuit resistance and thus a lower time constant and, as a result, the voltage being measured upsurges or decays more quickly.

Advantageously, the measurement switch is closed when the voltage at the voltage measurement device drops below a voltage threshold. This can prevent damage, caused for example by current peaks, to sensitive electronic systems in the measurement system.

The charging circuit can, for example, be composed of a voltage source and a capacitor applied in parallel therewith. In the process, a charging switch can connect the voltage source to the capacitor, the charging process of the capacitor beginning after the charging switch is closed. As soon as the charging switch is opened thereafter, a charge remains stored in the capacitor. Subsequently, according to the present teaching the capacitor can be discharged via the voltage measurement device after the discharge switch is closed and, after the measurement switch is closed and if contacting is successful, via the entire impedance of the unit consisting of the voltage measurement device and measurement system.

It is also possible to use the device such that, after contacting is successful, any voltage applied at the measurement points is determined, advantageously by the voltage measurement device present in the measurement circuit. The application of the voltage at the measurement points can be established from the voltage curve while the contacting is being established or thereafter.

In addition, the value of this voltage applied at the measurement points of the electrical system can be measured. Advantageously, this voltage is measured by the voltage measurement device present in the measurement circuit.

BRIEF DESCRIPTION OF THE DRAWINGS

The present teaching will now be explained in more detail with reference to FIGS. 1 to 3, which show example, schematic, non-limiting, advantageous embodiments of the present teaching and in which.

DETAILED DESCRIPTION

Figure 1:
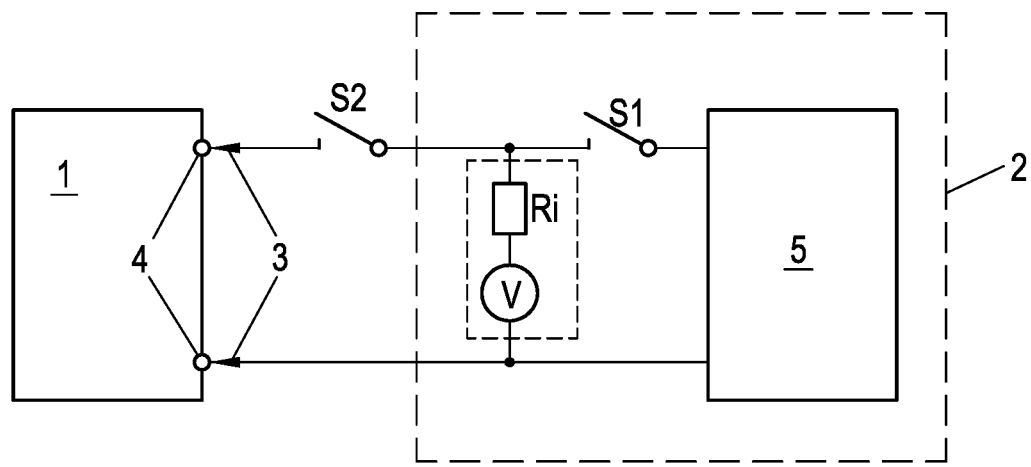
FIG. 1 shows an electrical system connected to a measurement instrument.

On the basis of FIG. 1, the basic method according to the present teaching is described using a measurement system 2 according to the present teaching. The de-energized state of an electrical system 1, e.g. an electric propulsion system of a hybrid vehicle, is to be determined using a measurement instrument 2 before work can be carried out on the electrical system 1. To do so, measurement contacts 3, e.g. prepared measurement points, are provided on the electrical system 1 and should be contacted by the measurement contacts 4 of the measurement instrument 2 in order to measure the voltage of any voltage possibly applied. For the voltage measurement, a conventional voltage measurement device V having an internal resistance $R_i$ is provided in the measurement system 2 (indicated in FIG. 1). To reliably determine proper contacting, the measurement instrument 2 also consists of a charging circuit 5 in addition to the voltage measurement device V. The charging circuit 5 has a charge storage for storing electrical charge and can thus be, for example, a capacitor, an electrical energy store, etc. Of course, any other type of energy source can be used. The charging circuit 5 can be connected to the voltage measurement device V by means of a discharge switch S1. The charging circuit 5 is thus discharged via the internal resistance $R_i$ of the voltage measurement device V, the voltage measurement device V recording the characteristic voltage curve $U_{char}$, resulting from the internal resistance $R_i$, of the measurement system 2. The discharge switch S1 remains closed and the measurement switch S2 is closed subsequently; as a result of this, if the measurement contacts 3 are correctly contacted with the electrical system 1, the impedance of the entire system, consisting of the measurement system 2, i.e. the voltage measurement device V having the internal resistance $R_i$ plus the charging circuit 5, and the electrical system 1, is changed. Correct contacting can be concluded from the curve of the voltage U at the voltage measurement device V before and after the measurement switch S2 is closed.

Figure 2A:
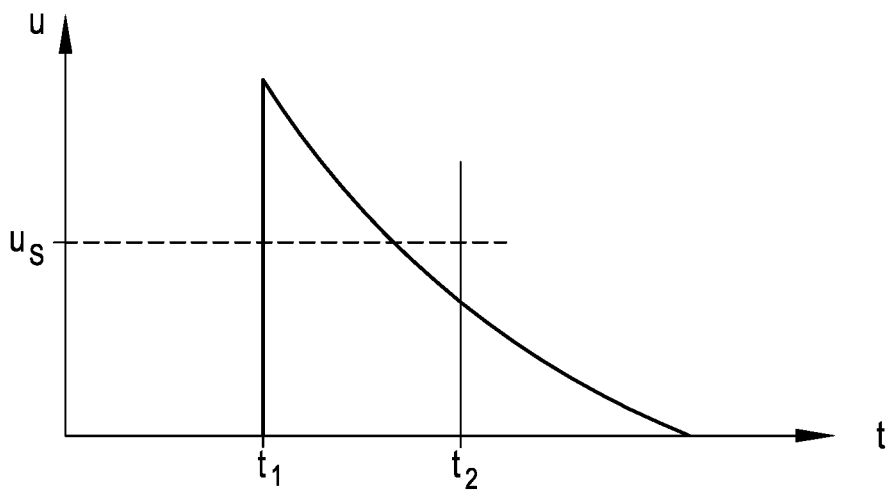
FIGS. 2A-2C show different curves for the voltage U.

The characteristic voltage curve $U_{char}$ is shown in FIG. 2a. At the time $t_1$, the discharge switch S1 is closed and the voltage curve decays at the voltage measurement device. If the electrical system 1 is not contacted, for example if a measurement contact 4 is not applied or not fully applied at the measurement contacts 3, the curve of the voltage U at the voltage measurement device V after closure of the measurement switch S2 (in FIG. 1 at the time $t_2$) continues to follow the characteristic voltage curve $U_{char}$ of the measurement system 2. The charging circuit 5 is thus discharged only via the internal resistance $R_i$ of the voltage measurement device V; there is no sudden change in the voltage curve U.

If the electrical system 1 is contacted, the measurement system 2, consisting of the charging circuit 5 and the voltage measurement device V having the internal resistance $R_i$, is expanded to include the electrical system 1 after the measurement switch 2 is closed. As a result of this expansion, the impedance of the electrical system 1 is added to the impedance of the measurement system 2 and the total impedance via which the discharge current flows is thus changed. This causes a change in the voltage curve U at the voltage measurement device V, as outlined in FIGS. 2b and 2c and as described below in detail. It can thus be concluded that contacting is successful.

Advantageously, the measurement switch S2 is closed when the voltage at the voltage measurement device V drops below a voltage threshold $U_s$, as shown in FIG. 2, after the discharge switch S1 is closed. This can prevent damage, caused for example by current peaks, to sensitive electronic systems in the measurement system 2.

Figure 3:
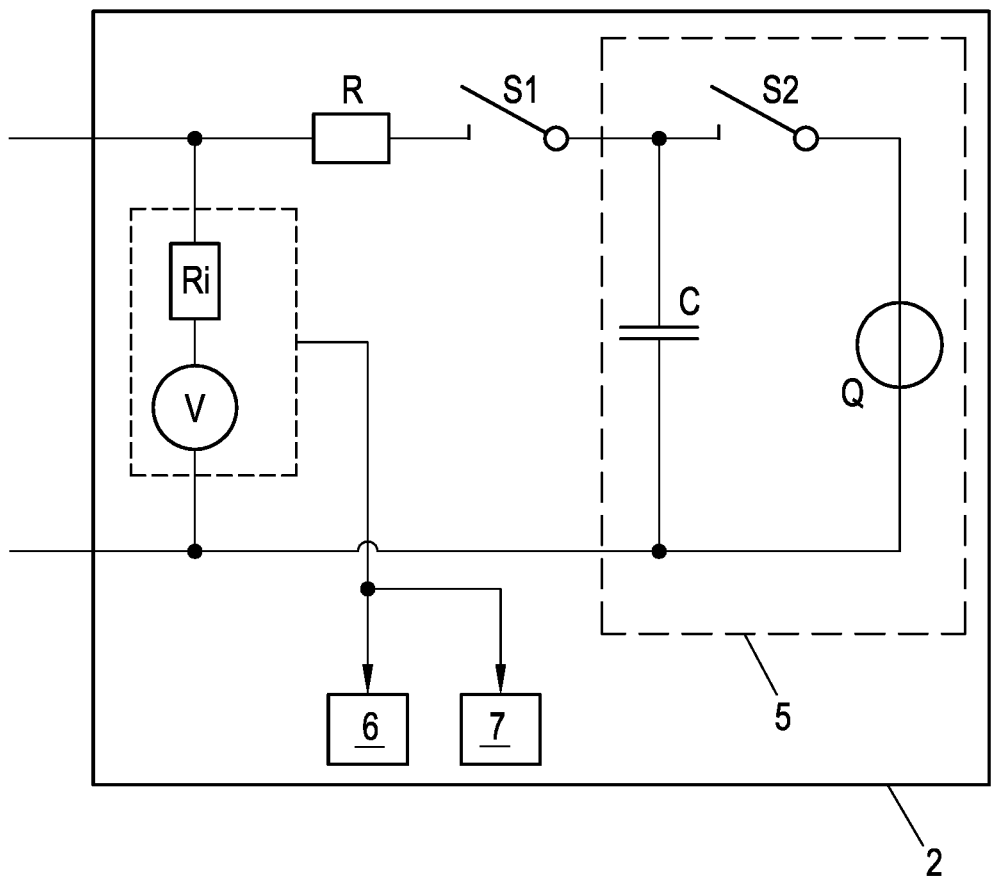
FIG. 3 shows a possible embodiment of the measurement instrument.

In addition to the internal resistance $R_i$ of the voltage measurement device, as shown in FIG. 3 a discharge resistor $R_i$ can be used to influence the voltage curve U and thus also the curve of the characteristic voltage $U_{char}$ of the measurement system 2, in particular a time constant. Connecting the discharge resistor R in parallel with the voltage measurement device V leads to a reduction in the impedance of the measurement system and thus to a reduction in the time constant. This achieves a quicker curve progression. If the discharge resistor R is connected in series with the voltage measurement device V, the impedance of the measurement system 2 and thus the time constant increase, yet the maximum current is also reduced, causing protection of sensitive electronic components.

As shown in FIG. 3, the charging circuit can be designed as a voltage or current source Q that can be connected in parallel with a capacitor C by means of a charging switch S3. Once the charging switch S3 is closed, the capacitor C is charged. When the discharge switch S1 is opened again thereafter, according to the present teaching the charged capacitor can be discharged via the voltage measurement device V. The discharge switch S1 can also be closed when the charging switch S3 is still closed. To ensure the charging circuit 5 is discharged, however, the charging switch S3 should always be opened for a certain period of time when the measurement system 5 is connected to the electrical circuit 1 by the measurement switch S2. If the discharging process of the charging circuit 5 does not begin before the measurement switch S2 is closed, it would not be possible to record the characteristic voltage curve $U_{char}$ of the charging circuit 5 since the electrical system would have already changed the total impedance.

The voltage measured by the voltage measurement device V can be analyzed in an analysis unit 6 and can be displayed on a display unit 7. For this purpose, the measured voltage can of course be digitized in the analysis unit in a known manner.

Figure 2B:
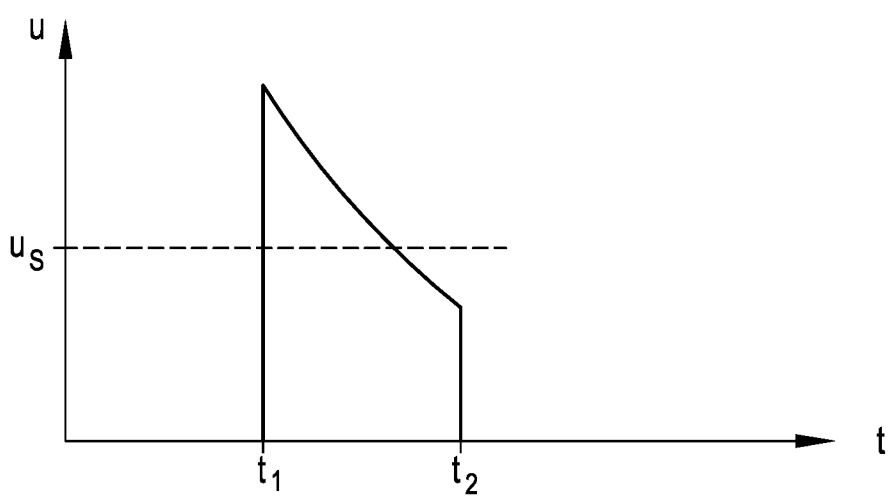

The output impedance of the electrical system 1, which is located between the measurement contacts 4, is generally low. As a result, if an electrical system 1 is successfully contacted but de-energized between the measurement points 3, the voltage U at the voltage measurement device V drops significantly after the measurement switch S2 is closed at the time $t_2$, as shown in FIG. 2b. This is the result of the lower total impedance via which the charging circuit 5, composed of the electrical system 1 and the measurement circuit 2, is discharged.

Figure 2C:
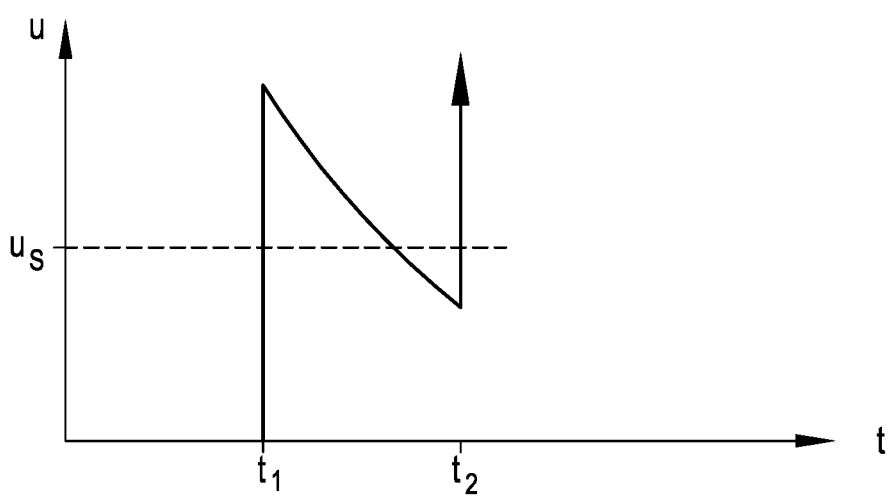

If the electrical system 1 is contacted and electrically charged, the curve of the voltage U at the voltage measurement device V increases significantly after closure of the measurement switch S2 at the time $t_2$, as can be seen in FIG. 2c.

Therefore, it is not only possible to draw conclusions on correct contacting, but also on whether, if contacting is successful, the electrical system is energized or de-energized. Advantageously, the voltage measurement device V is used to detect the presence of a voltage at the measurement points 3.

The method and the device can thus also measure the voltage applied at the measurement points 3, which corresponds to the implementation of a voltage measurement mode or a voltage measurement device. To do so, after successful contacting has been demonstrated and an applied voltage has been detected, the discharge switch S1 can be opened in order to measure the voltage applied at the measurement contact using the voltage measurement device V. This procedure can also be automated, i.e. correct contacting is determined first prior to a voltage measurement, and the voltage is only measured when the contacting has occurred.

The invention claimed is:

1. A method for determining an electrical contacting of an electrical system with a measurement system, the measurement system being connectable to measurement points of the electrical system by means of measurement contacts, wherein, in the measurement system,
   closing a discharge switch connecting a charging circuit to a voltage measurement device,
   discharging the charging circuit is discharged via an internal resistance of the voltage measurement device, and in that,
   when the discharge switch is closed, closing a measurement switch connecting the voltage measurement device to the measurement contacts,
   determining the contacting of the electrical system with the measurement system by analyzing a voltage curve at the voltage measurement device starting from closure of the measurement switch.

2. The method according to claim 1, wherein, after the discharge switch is closed and before the measurement switch is closed, a characteristic voltage curve of the measurement system is recorded by means of the voltage measurement device, and in that the characteristic voltage curve is compared with the voltage curve after the measurement switch is closed.

3. The method according to claim 1, wherein, after the discharge switch is closed, the charging circuit is discharged via a discharge resistor connected in series or in parallel with the voltage measurement device and via the internal resistance.

4. The method according to claim 3, wherein the measurement switch is closed when a characteristic voltage curve drops below a voltage threshold at the voltage measurement device.

5. The method according to claim 1, wherein the measurement switch is closed when a characteristic voltage curve drops below a voltage threshold at the voltage measurement device.

6. A device for determining an electrical contacting of an electrical system with a measurement system, the measurement system being connectable to measurement points of the electrical system by means of measurement contacts, comprising:
   a charging circuit,
   a discharge switch,
   a voltage measurement device having an internal resistance,
   the discharge switch, when in the closed state, connecting the charging circuit to the voltage measurement device, discharging said circuit via the internal resistance and the voltage measurement device thus recording a characteristic voltage curve of the measurement system,
   a measurement switch connecting the voltage measurement device to the measurement contacts,
   an analysis unit serves to determine the electrical contacting of the electrical system with the measurement system from a voltage curve at the voltage measurement device after closure of the measurement switch.

7. The device according to claim 6, wherein a discharge resistor is provided and is connected to the voltage measurement device in series or in parallel such that the charging circuit discharges via both the discharge resistor and the internal resistance after the discharge switch is closed.

8. The device according to claim 6, wherein the charging circuit consists of a voltage source, a capacitor and a charging switch, the voltage source being connected in series with the capacitor and the charging switch, and the voltage source being intended for charging the capacitor after the charging switch is closed.

9. The device according to claim 6, wherein a display unit is provided and shows the voltage curve at the voltage measurement device.

10. Use of the device according to claim 6, wherein, after the contacting has been successfully checked, the voltage measurement device is used to determine whether an electrical voltage is applied at the measurement points of the electrical system.

11. The use according to claim 10, wherein, if it is determined that an electrical voltage is present at the measurement points of the electrical system, the value of the electrical voltage at the measurement points is ascertained.

12. A measurement system for an electrical system, comprising:
   measurement contacts connecting to measurement points of the electrical system;
   a charging circuit;
   a voltage measurement device;
   a discharge switch connecting the charging circuit and the voltage measurement device, the charging circuit discharged via an internal resistance of the voltage measurement device when the discharge switch is closed;
a measurement switch connecting the measurement contacts and the voltage measurement device;
wherein the contacting of the electrical system with the measurement system is determined by analyzing a voltage curve at the voltage measurement device when the discharge switch is closed and then the measurement switch is closed.

13. The measurement system according to claim 12, wherein a characteristic voltage curve, measured after the discharge switch is closed and before the measurement switch is closed, is compared with the voltage curve after the measurement switch is closed.

14. The measurement system according to claim 13, wherein, after the contacting of the electrical system with the measurement system is determined, the voltage measurement device determines whether there is an electrical voltage at the measurement points of the electrical system.

15. The measurement system according to claim 13, wherein the measurement switch is closed when the characteristic voltage curve drops below a voltage threshold at the voltage measurement device.

16. A method for determining an electrical contacting of an electrical system with a measurement system, comprising:
providing the measurement system according to claim 12;
connecting the measurement contacts of the measurement system to measurement points of the electrical system;
closing the discharge switch to discharge the charging circuit;
closing the measurement switch;
determining the contacting of the electrical system with the measurement system by analyzing the voltage curve at the voltage measurement device starting from closure of the measurement switch.

17. The method according to claim 16, wherein a characteristic voltage curve, measured after the discharge switch is closed and before the measurement switch is closed, is compared with the voltage curve after the measurement switch is closed.

* * * * *